(12) United States Patent
Koike

(10) Patent No.: US 11,570,899 B2
(45) Date of Patent: Jan. 31, 2023

(54) CIRCUIT BOARD AND PRODUCTION METHOD THEREFOR, AND ELECTRONIC DEVICE AND PRODUCTION METHOD THEREFOR

(71) Applicant: Material Concept, Inc., Sendai (JP)

(72) Inventor: Junichi Koike, Sendai (JP)

(73) Assignee: MATERIAL CONCEPT, INC., Sendai (JP)

( * ) Notice: Subject to any disclaimer, the term of this patent is extended or adjusted under 35 U.S.C. 154(b) by 0 days.

(21) Appl. No.: 17/255,606

(22) PCT Filed: Jun. 28, 2019

(86) PCT No.: PCT/JP2019/025822
§ 371 (c)(1),
(2) Date: Dec. 23, 2020

(87) PCT Pub. No.: WO2020/004624
PCT Pub. Date: Jan. 2, 2020

(65) Prior Publication Data
US 2021/0267066 A1    Aug. 26, 2021

(30) Foreign Application Priority Data

Jun. 29, 2018 (JP) .............................. JP2018-125302
Sep. 25, 2018 (JP) .............................. JP2018-178736

(51) Int. Cl.
*H05K 1/18*  (2006.01)
*H05K 1/03*  (2006.01)

(52) U.S. Cl.
CPC ........... *H05K 1/189* (2013.01); *H05K 1/0313* (2013.01); *H05K 2201/10287* (2013.01)

(58) Field of Classification Search
CPC ................ H05K 1/189; H05K 1/0313; H05K 2201/10287; H05K 1/18
(Continued)

(56) References Cited

U.S. PATENT DOCUMENTS 6,495,769 B1   12/2002  Saito et al.
2012/0031656 A1  2/2012  Oka et al.
(Continued)

FOREIGN PATENT DOCUMENTS

JP    S6272200 A    4/1987
JP    H04037497 A   2/1992
(Continued)

OTHER PUBLICATIONS

International Search Report for International Application No. PCT/JP2019/025822; dated Aug. 13, 2019.
(Continued)

*Primary Examiner* — Tremesha S Willis
(74) *Attorney, Agent, or Firm* — Cantor Colburn LLP

(57) ABSTRACT

A circuit board that has flexibility owing to an organic insulating layer and that still has high adhesion between metal wiring and the organic insulating layer; and a method for producing the circuit board without employing photolithography. The circuit board comprising a metal wiring arrangement portion and a metal wiring non-arrangement portion, wherein: in the metal wiring arrangement portion, metal wiring, a first diffusion layer, and a first organic insulating layer are stacked; in the metal wiring non-arrangement portion, a metal oxide layer, a second diffusion layer, and a second organic insulating layer are stacked; the metal wiring is made of a first metal element; and the first diffusion layer contains the first metal element and a second metal element.

12 Claims, 4 Drawing Sheets

(58) Field of Classification Search
USPC .......................................................... 361/749
See application file for complete search history.

(56) References Cited

U.S. PATENT DOCUMENTS

2017/0118836 A1    4/2017   Kim et al.
2017/0290150 A1   10/2017  Kasuga et al.

FOREIGN PATENT DOCUMENTS

| JP | H05136547 A | 6/1993 |
| JP | 2000286559 A | 10/2000 |
| JP | 2010272837 A | 12/2010 |
| JP | 2016119424 A | 6/2016 |
| WO | 201505050081 A | 4/2015 |

OTHER PUBLICATIONS

Y. Cao, et al., "Ni—Cr selective surface based on polyamide substrate", Elsevier, Thin Solid Films vol. 365(1), pp. 49-52 (2000) ; Accepted, Nov. 30, 1999.

CIRCUIT BOARD AND PRODUCTION METHOD THEREFOR, AND ELECTRONIC DEVICE AND PRODUCTION METHOD THEREFOR

CROSS REFERENCE TO RELATED APPLICATIONS

This is the U.S. national stage of application No. PCT/JP2019/025822, filed on Jun. 28, 2019. Priority under 35 U.S.C. § 119(a) and 35 U.S.C. § 365(b) is claimed from Japanese Application No. 2018-125302, filed Jun. 29, 2018 and Japanese Application No. 2018-178736, filed Sep. 25, 2018, the disclosure of which is also incorporated herein by reference.

TECHNICAL FIELD

The present invention relates to a circuit board, a circuit board production method, an electronic device, and an electronic device production method.

BACKGROUND ART

A flexible circuit board include a bendable organic insulating film as a board and metal wiring formed on this film.

A metal wiring formation method includes three types of methods including a subtractive method, a semi-additive method, and an additive method. Specifically, in the subtractive method, metal foil is bonded to a board, and wiring is formed by a photolithography step. In the semi-additive method, after a board has been coated with a thin film to be a seed layer by, e.g., a sputtering method, wiring is formed by electroplating (see Patent Documents 1 and 2). In the additive method, metal wiring is directly drawn on a board by inkjet or screen printing.

Any of the subtractive method and the semi-additive method requires the photolithography step. For example, in addition to a great number of steps, waste liquid treatment is required, and a load on cost and environment is high. On the other hand, the additive method is advantageous because no photolithography step is required.

However, by only forming the metal wiring on the board, the adhesion strength of the metal wiring is weak, and for this reason, there is a problem that the metal wiring is easily detached. For enhancing the adhesion strength between the metal wiring and the board, there is a method in which a Ni—Cr alloy thin film is formed as an adhesive layer on a board in advance and metal wiring is subsequently formed (see, e.g., Non-Patent Document 1). However, if this method is used, the Ni—Cr alloy thin film needs to be etched in a wiring shape, and the photolithography step is required.

A flexible circuit board in which metal wiring is formed by the additive method does not have sufficient adhesion at an interface between the metal wiring and an organic insulating layer, and it is necessary that a metal alloy seed layer is formed using a photolithography method. This method requires a great number of steps and the waste liquid treatment, and for this reason, there is a problem that this method is expensive and has a high environmental load.

Patent Document 1: Japanese Unexamined Patent Application, Publication No. S62-72200
Patent Document 2: Japanese Unexamined Patent Application, Publication No. H05-136547
Non-Patent Document 1: Y. Cao, J. Tian, and X. Hu, This Solid Films, Vol. 365(1), pp. 49-52(2000)

DISCLOSURE OF THE INVENTION

Problems to be Solved by the Invention

The present invention has been made in view of the above-described situation, and an object of the present invention is to provide a circuit board having flexibility derived from an organic insulating layer while having a high adhesion between metal wiring and the organic insulating layer and to provide the method for producing the circuit board without using a photolithography method.

Means for Solving the Problems

Intensive study has been conducted for solving the above-described problems by the present inventor. As a result, it has been found that a circuit board including a metal wiring arrangement portion and a metal wiring non-arrangement portion can be a circuit board in which higher adhesion is provided between its metal wiring and organic insulating layer by configuring a structure including a metal wiring arrangement portion in which the metal wiring, a first diffusion layer, and a first organic insulating layer are stacked with each other, together with a metal wiring non-arrangement portion in which a metal oxide layer, a second diffusion layer, and a second organic insulating layer are stacked with each other, such that the metal wiring, the first diffusion layer, the oxide layer, and the second diffusion layer include metal elements having a particular relationship; and such a circuit board can be obtained by forming a metal layer on the surface of an organic insulating layer, together with pre-sintered wiring on the surface of the metal layer to form a pre-sintered board, such that the pre-sintered wiring has a particular relationship with the metal element included in the metal layer, and by heating the pre-sintered board in an oxidizing atmosphere and subsequently in a reducing atmosphere. Thus, the present inventor has arrived at the present invention. Specifically, the present invention provides the following aspects.

(1) A circuit board including a metal wiring arrangement portion and a metal wiring non-arrangement portion,
in which, in the metal wiring arrangement portion, metal wiring, a first diffusion layer, and a first organic insulating layer are stacked with each other,
in the metal wiring non-arrangement portion, a metal oxide layer, a second diffusion layer, and a second organic insulating layer are stacked with each other,
the metal wiring includes a first metal element,
the first diffusion layer includes the first metal element and a second metal element,
the metal oxide layer includes an oxide of the second metal element,
the second diffusion layer includes the second metal element, and
the second metal element has a stronger oxide-forming tendency than that of the first metal element.

(2) A circuit board including a metal wiring arrangement portion and a metal wiring non-arrangement portion,
in which, in the metal wiring arrangement portion, metal wiring, a first diffusion layer, and a first organic insulating layer are stacked with each other,
in the metal wiring non-arrangement portion, a metal oxide layer, a second diffusion layer, and a second organic insulating layer are stacked with each other,
the metal wiring includes a first metal element,
the first diffusion layer includes the first metal element and a second metal element, the metal oxide layer includes an oxide of the second metal element, the second diffusion layer includes the second metal element, the first metal element is one or more elements selected from the group consisting of Cu, Ag, and Ni, and the second metal element is one or more elements selected from the group consisting of Mn, Cr, V, Nb, Ta, Ti, and Zr.

(3) A circuit board including a metal wiring arrangement portion and a metal wiring non-arrangement portion, in which, in the metal wiring arrangement portion, metal wiring, a first diffusion layer, and a first organic insulating layer are stacked with each other, in the metal wiring non-arrangement portion, a metal oxide layer, a second diffusion layer, and a second organic insulating layer are stacked with each other, the average thickness of the first diffusion layer is greater than the average thickness of the second diffusion layer, the metal wiring includes a first metal element, the first diffusion layer includes the first metal element and a second metal element, the metal oxide layer includes an oxide of the second metal element, the second diffusion layer includes the second metal element, and the second metal element has a stronger oxide-forming tendency than that of the first metal element.

(4) The circuit board according to (3), in which the first metal element is one or more elements selected from the group consisting of Cu, Ag, and Ni, and the second metal element is one or more elements selected from the group consisting of Mn, Cr, V, Nb, Ta, Ti, and Zr.

(5) The circuit board according to (1) or (2), in which the average thickness of the first diffusion layer with respect to the average thickness of the second diffusion layer (the average thickness of the first diffusion layer/the average thickness of the second diffusion layer) is equal to or greater than five times and equal to or less than 500 times.

(6) The circuit board according to any one of (1) to (5), in which the metal wiring has a porous structure.

(7) The circuit board according to (6), in which the metal wiring includes metal plating made of one or more elements selected from the group consisting of Cu, Ag, and Ni in a void in the porous structure.

(8) The circuit board according to (6), in which the metal wiring includes thermosetting resin in a void in the porous structure.

(9) An electronic device including a metal wiring arrangement portion, a metal wiring non-arrangement portion, and at least one electronic component selected from a passive component and an active component, in which, in the metal wiring arrangement portion, metal wiring, a first diffusion layer, and a first organic insulating layer are stacked with each other, in the metal wiring non-arrangement portion, a metal oxide layer, a second diffusion layer, and a second organic insulating layer are stacked with each other, the metal wiring includes a first metal element, the first diffusion layer includes the first metal element and a second metal element, the metal oxide layer includes an oxide of the second metal element, the second diffusion layer includes the second metal element, the second metal element has a stronger oxide-forming tendency than that of the first metal element, and the at least one electronic component is connected to the metal wiring.

(10) An electronic device including a metal wiring arrangement portion, a metal wiring non-arrangement portion, and at least one electronic component selected from a passive component and an active component, in which, in the metal wiring arrangement portion, metal wiring, a first diffusion layer, and a first organic insulating layer are stacked with each other, in the metal wiring non-arrangement portion, a metal oxide layer, a second diffusion layer, and a second organic insulating layer are stacked with each other, the metal wiring includes a first metal element, the first diffusion layer includes the first metal element and a second metal element, the metal oxide layer includes an oxide of the second metal element, the second diffusion layer includes the second metal element, the first metal element is one or more elements selected from the group consisting of Cu, Ag, and Ni, the second metal element is one or more elements selected from the group consisting of Mn, Cr, V, Nb, Ta, Ti, and Zr, and the at least one electronic component is connected to the metal wiring.

(11) An electronic device including a metal wiring arrangement portion, a metal wiring non-arrangement portion, and at least one electronic component selected from a passive component and an active component, in which, in the metal wiring arrangement portion, metal wiring, a first diffusion layer, and a first organic insulating layer are stacked with each other, in the metal wiring non-arrangement portion, a metal oxide layer, a second diffusion layer, and a second organic insulating layer are stacked with each other, the average thickness of the first diffusion layer is greater than the average thickness of the second diffusion layer, the metal wiring includes a first metal element, the first diffusion layer includes the first metal element and a second metal element, the metal oxide layer includes an oxide of the second metal element, the second diffusion layer includes the second metal element, the second metal element has a stronger oxide-forming tendency than that of the first metal element, and the at least one electronic component is connected to the metal wiring.

(12) The electronic device according to (9) to (11), in which the metal wiring and the at least one electronic component are joined to each other by solder alloy, and the solder alloy is present in a void in the metal wiring.

(13) A circuit board production method including the metal layer formation step of forming, on a surface of an organic insulating layer, a metal layer from a second metal element having a stronger oxide-forming tendency than that of a first metal element, the pre-sintered board formation step of forming, on a surface of the metal layer, pre-sintered wiring having the first metal element to form a pre-sintered board provided with the pre-sintered wiring, and the sintering step of subjecting the pre-sintered board to heating at a temperature equal to or greater than 150° C. and equal to or less than 450° C. in an oxidizing atmosphere, followed by heating in a reducing atmosphere to sinter the same.

(14) A circuit board production method including the metal layer formation step of forming, on a surface of an organic insulating layer, a metal layer from a second metal element which is one or more elements selected from the group consisting of Mn, Cr, V, Nb, Ta, Ti, and Zr, the pre-sintered board formation step of forming, on a surface of the metal layer, pre-sintered wiring having a first metal element which is one or more elements selected from the group consisting of Cu, Ag, and Ni to form a pre-sintered board provided with the pre-sintered wiring, and the sintering step of subjecting the pre-sintered board to heating at a temperature equal to or greater than 150° C. and equal to or less than 450° C. in an oxidizing atmosphere, followed by heating in a reducing atmosphere to sinter the same.

(15) An electronic device production method including the metal layer formation step of forming, on a surface of an organic insulating layer, a metal layer from a second metal element having a stronger oxide-forming tendency than that of a first metal element, the pre-sintered wiring formation step of forming, on a surface of the metal layer, pre-sintered wiring having the first metal element to form a pre-sintered board provided with the pre-sintered wiring, the sintering step of subjecting the pre-sintered board to heating at a temperature equal to or greater than 150° C. and equal to or less than 450° C. in an oxidizing atmosphere, followed by heating in a reducing atmosphere to sinter the same, and the component joining step of joining at least one electronic component selected from a passive component and an active component to the metal wiring by means of application of a solder flux with a pH equal to or greater than 4 and equal to or less than 7.

(16) An electronic device production method including the metal layer formation step of forming, on a surface of an organic insulating layer, a metal layer from a second metal element which is one or more elements selected from the group consisting of Mn, Cr, V, Nb, Ta, Ti, and Zr, the pre-sintered wiring formation step of forming, on a surface of the metal layer, pre-sintered wiring having a first metal element which is one or more elements selected from the group consisting of Cu, Ag, and Ni to form a pre-sintered board provided with the pre-sintered wiring, the sintering step of subjecting the pre-sintered board to heating at a temperature equal to or greater than 150° C. and equal to or less than 450° C. in an oxidizing atmosphere, followed by heating in a reducing atmosphere to sinter the same, and the component joining step of joining at least one electronic component selected from a passive component and an active component to the metal wiring by means of application of a solder flux with a pH equal to or greater than 4 and equal to or less than 7.

Effects of the Invention

The present invention makes it possible to provide a circuit board with a high adhesion between the metal wiring and the organic insulating layer, together with a method for producing the circuit board without using a photolithography method.

PREFERRED MODE FOR CARRYING OUT THE INVENTION

Hereinafter, a specific embodiment of the present invention will be described in detail. The present invention is not limited to the following embodiment, and as necessary, changes can be made to the present invention within the scope of the object of the present invention.

<Circuit Board>

A circuit board according to the present embodiment includes a metal wiring arrangement portion and a metal wiring non-arrangement portion. Hereinafter, each portion will be described in detail with reference to the drawings. Note that the "metal wiring arrangement portion" indicates a portion having a layered structure in which metal wiring and a first organic insulating layer are disposed at each end in a stacking direction of the metal wiring and the first organic insulating layer. Moreover, the "metal wiring non-arrangement portion" indicates a portion having a layered structure in which a metal oxide layer and a second organic insulating layer are dispersed at each end in a stacking direction of the metal oxide layer and the second organic insulating layer.

[Metal Wiring Arrangement Portion]

Figure 1:
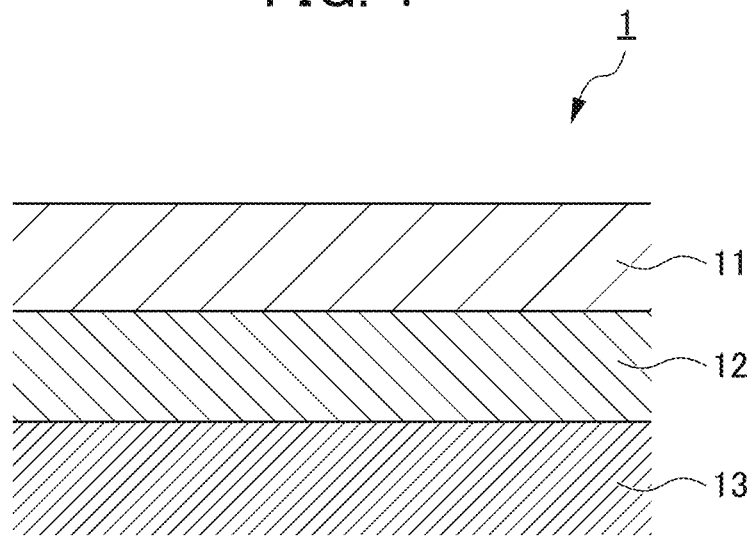
FIG. 1 is a schematic longitudinal sectional view of a metal wiring arrangement portion.

FIG. 1 is a schematic longitudinal sectional view of the metal wiring arrangement portion. In the metal wiring arrangement portion 1, the metal wiring 11, a first diffusion layer 12, and the first organic insulating layer 13 are stacked with each other. The metal wiring 11 described herein includes a first metal element. The first diffusion layer 12 includes the first metal element and a second metal element.

[First Metal Element]

As described above, the first metal element forms the metal wiring 11. Thus, the first metal element needs to have sufficient conductivity. Specifically, a metal element having a specific resistance of a bulk material at 20° C. equal to or less than $10 \times 10^{-8}$ $\Omega$m is preferably used, a metal element having the specific resistance equal to or less than $7 \times 10^{-8}$ $\Omega$m is more preferably used, and a metal element having the specific resistance equal to or less than $3 \times 10^{-8}$ $\Omega$m is much more preferably used. Moreover, the first metal element preferably has a higher conductivity than that of the second metal element. Thus, the first metal element can cause the metal wiring 11 to carry the sufficient conductivity, and can maintain insulation properties between the metal wiring.

[Second Metal Element]

The second metal element forms the metal oxide layer in the metal wiring non-arrangement portion, and therefore, is preferably metal easily forming an oxide. Particularly in the case of production by a later-described production method, the second metal element needs to be easily oxidized after thermal treatment and maintain the insulation properties between the metal wiring. Thus, the second metal element needs to be a metal element showing a stronger oxide-forming tendency as compared to the above-described first metal element. Regarding the "oxide-forming tendency" described herein, when two elements are compared to each other in an Ellingham diagram in which a Gibbs free energy in oxide formation is plotted against temperature, if one metal element (an element X) is on a lower side of the other metal element (an element Y), i.e., if one metal element has a higher negative free energy, the aforementioned one metal element (the element X) shows a stronger oxide-forming tendency compared to the other metal element (the element Y).

For example, as a metal element satisfying such a condition, it is possible to use at least one element selected from the group consisting of Cu, Ag, and Ni as the first metal element, and at least one element selected from the group consisting of Mn, Cr, V, Nb, Ta, Ti, and Zr as the second metal element. The same definitions of the "first metal element" and the "second metal element" also apply below.

[Metal Wiring]

The metal wiring 11 includes the first metal element. The metal wiring 11 acts as a conductive path on the circuit board.

For example, such a metal element includes copper (Cu), silver (Ag), and nickel (Ni). When copper is used as the metal wiring 11, wiring with a low resistance can be provided at a low cost.

When silver is used, oxidization of the wiring can be avoided even in high-temperature firing. When nickel is used, electromigration failure caused in a high current density load state can be reduced.

As long as the metal wiring 11 can carry the conductivity, the metal wiring 11 may be an alloy made of metal elements including the first metal element.

Although not particularly limited, the metal wiring 11 preferably has a porous structure. When the metal wiring has the porous structure as described above, the elastic modulus of the metal wiring is less than that of bulk pure metal and is close to that of an organic material forming the first organic insulating layer 13.

Thus, a flexible circuit board with excellent durability against, e.g., repeated bending can be provided such that stress concentration between the metal wiring 11 and the first organic insulating layer 13 is reduced during elastic deformation.

For example, a sintered body of metal particles including the above-described metal element can be used as the metal wiring 11 with the above-described porous structure. When the metal particles are sintered, the metal particles are partially melted and joined to each other to form the porous structure. A void volume fraction in the metal wiring 11 is preferably equal to or greater than 2% by volume, more preferably equal to or greater than 5% by volume, much more preferably equal to or greater than 10% by volume, and still much more preferably equal to or greater than 20% by volume. Moreover, the void volume fraction is preferably equal to or less than 50% by volume, more preferably equal to or less than 45% by volume, much more preferably equal to or less than 40% by volume, and still much more preferably equal to or less than 35% by volume.

In this porous structure of the metal wiring 11, a void is present inside, and therefore, a portion with a low mechanical strength is present. For example, in a case where the metal wiring 11 is the sintered body, the portion with the low mechanical strength includes a portion called a "neck" at which a sintered portion of the particles is thinly formed. When the metal wiring 11 deforms due to deformation of the circuit board, force is concentrated on such a portion due to deformation, and local failure is likely to occur.

For this reason, in a case where the metal wiring 11 has the porous structure, the metal wiring 11 preferably includes, in the void in the porous structure thereof, metal plating made of a metal element having conductivity, particularly one or more metal elements selected from the group consisting of Cu, Ag, and Ni. These one or more metal elements are the same as the first metal elements forming the metal wiring 11. When the metal plating made of one or more metal elements selected from the group consisting of Cu, Ag, and Ni is present in the void in the porous structure as described above, the force concentrated on the neck due to deformation can be dispersed and durability against, e.g., bending and expansion/contraction can be improved. Further, a void is filled with the metal having the conductivity, and therefore, an electrical resistivity decreases.

The rate of filling of the void with the plating can be derived using an expression of ((a void fraction before plating)−(a void fraction after plating))/(the void fraction before plating) after a metal wiring sectional structure before and after plating has been observed using a scanning electron microscope (SEM). When a metal wiring section is prepared using a cross-section polisher, accurate measurement can be performed. Although not particularly limited, the rate of filling of the void with the plating is preferably equal to or greater than 30% by volume, more preferably equal to or greater than 40% by volume, much more preferably equal to or greater than 50% by volume, and still much more preferably equal to or greater than 60% by volume. When the rate of filling of the void with the plating is equal to or greater than a certain amount, durability against deformation can be enhanced. Moreover, the rate of filling of the void with the metal plating is preferably equal to or less than 90% by volume, more preferably equal to or less than 80% by volume, and much more preferably equal to or less than 70% by volume. When the rate of filling of the void with the metal plating is equal to or less than a certain amount, wiring shape distortion due to excessive plating on a metal electrode surface other than the void can be prevented.

Similarly, when the void in the porous structure of the metal wiring 11 is filled with thermosetting resin, the durability against deformation can be improved. In terms of the durability, filling with the thermosetting resin is less advantageous than filling with the metal by a plating method, but is advantageous because the void can be easily filled with the thermosetting resin. For example, a specific method for filling the void with the resin includes a method in which the resin is applied onto a metal wiring surface at room temperature and is left for about ten minutes in a pressure-reduced container with a pressure equal to or less than 10 Pa, thereby replacing pressure-reduced atmosphere outside the void and atmospheric-pressure atmosphere in the void to bring the resin to penetrate into the void. Alternatively, there is a method in which the porous structure is dipped in the resin or a solution/dispersion thereof and is dried (heated as necessary) or the porous structure is dipped in monomer or a solution/dispersion thereof and the monomer is polymerized thereafter. After the resin has been introduced into the void by the above-described operation, the resin is thermally cured at a high temperature, and as a result, the metal wiring 11 in which the void in the porous structure is filled with the thermosetting resin is obtained.

Although not particularly limited, phenol resin, epoxy resin, melamine resin, urea resin, unsaturated polyester resin, polyurethane, thermoset polyimide, etc. are preferably used as the thermosetting resin, for example.

Although not particularly limited, the rate of filling of the void with the thermosetting resin is, for example, preferably equal to or greater than 30% by volume, more preferably equal to or greater than 40% by volume, much more preferably equal to or greater than 50% by volume, and still much more preferably equal to or greater than 60% by volume. When the rate of filling of the void with the thermosetting resin is equal to or greater than a certain amount, the durability against deformation can be enhanced. Moreover, the rate of filling of the void with the thermosetting resin is preferably equal to or less than 90% by volume, more preferably equal to or less than 80% by volume, and much more preferably equal to or less than 70% by volume. When the rate of filling of the void with the thermosetting resin is equal to or less than a certain amount, occurrence of thermal stress due to a thermal expansion difference between the resin and the metal can be reduced and flexibility (flexibility) can be enhanced.

[First Diffusion Layer]

The first diffusion layer 12 includes the first metal element and the second metal element described above. With the first diffusion layer 12 described above, adhesion between the metal wiring 11 and the first organic insulating layer 13 can be enhanced. Note that an interface between the first diffusion layer 12 and the metal wiring 11 is defined as a position at which in the case of EDX measurement of the longitudinal sectional shape of the circuit board as illustrated in FIG. 1, an intensity derived from the first metal element is 80% with respect to the maximum intensity derived from the first metal element in the metal wiring 11 when scanning with an electron beam is performed in a direction from the metal wiring 11 to the first diffusion layer 12. Moreover, an interface between the first diffusion layer 12 and the first organic insulating layer 13 is defined as a position at which in the case of EDX measurement of the longitudinal sectional shape of the circuit board as illustrated in FIG. 1, a carbon atom intensity is 80% with respect to the maximum intensity derived from a carbon atom in the first organic insulating layer 13 when scanning is performed in a direction from the first organic insulating layer 13 to the first diffusion layer 12. A distance between an interface position between the metal wiring 11 and the first diffusion layer 12 and an interface position between the first diffusion layer 12 and the first organic insulating layer 13 as set above is taken as the thickness of the first diffusion layer. Similar EDX measurement is performed for five different sections, and the average of these measurement results is taken as the average thickness of the first diffusion layer.

Part of the first diffusion layer 12 may include an organic insulating body. That is, in such a partial region, the first metal element, the second metal element, and the organic insulating body can coexist. Moreover, in this partial region, the first metal element and the second metal element are preferably diffused in the organic insulating body. When the first metal element and the second metal element are diffused in the organic insulating body as described above, the adhesion between the metal wiring 11 and the first organic insulating layer 13 can be further enhanced.

Although not particularly limited, the average thickness of the first diffusion layer 12 is preferably equal to or greater than 3 nm, more preferably equal to or greater than 3.5 nm, much more preferably equal to or greater than 4 nm, and still much more preferably equal to or greater than 5 nm. When the average thickness of the first diffusion layer 12 is equal to or greater than a certain amount, the adhesion can be further enhanced. Moreover, the average thickness of the first diffusion layer 12 is preferably equal to or less than 4 µm, more preferably equal to or less than 3 µm, much more preferably equal to or less than 2 µm, and still much more preferably equal to or less than 1 µm.

Note that in a case where the second metal element is Mn, Cr, or Ta, the average thickness of the first diffusion layer 12 is preferably equal to or greater than 7 nm and more preferably equal to or greater than 10 nm, particularly considering enhancement of the adhesion between the metal wiring 11 and the first organic insulating layer 13. In a case where the second metal element is V, Nb, or Ti, the average thickness of the first diffusion layer 12 is preferably equal to or greater than 12 nm, more preferably equal to or greater than 15 nm, and much more preferably equal to or greater than 20 nm. In a case where the second metal element is Zr, the average thickness of the first diffusion layer 12 is preferably equal to or greater than 30 nm, more preferably equal to or greater than 40 nm, and much more preferably equal to or greater than 50 nm.

[First Organic Insulating Layer]

For example, an organic insulating body which is a resin having bendability, such as polyimide, liquid crystalline polymer, fluorine resin, polyethylene terephthalate, or polyethylene naphthalate, can be used to form the first organic insulating layer 13. Of these resins, the polyimide is preferably used from the viewpoint of excellent heat resistance and mechanical strength. Moreover, the first organic insulating layer 13 may be a single layer or a multilayer of two or more layers. Further, the first organic insulating layer 13 and the later-described second organic insulating layer may use the same organic insulating layer in common (this means that the first organic insulating layer 13 and the second organic insulating layer form one organic insulating layer), or may be two or more organic insulating layers joined to each other while insulation properties thereof are maintained.

Although not particularly limited, one in a film shape or a sheet shape is preferably used as the first organic insulating layer 13.

[Metal Wiring Non-Arrangement Portion]

Figure 2:
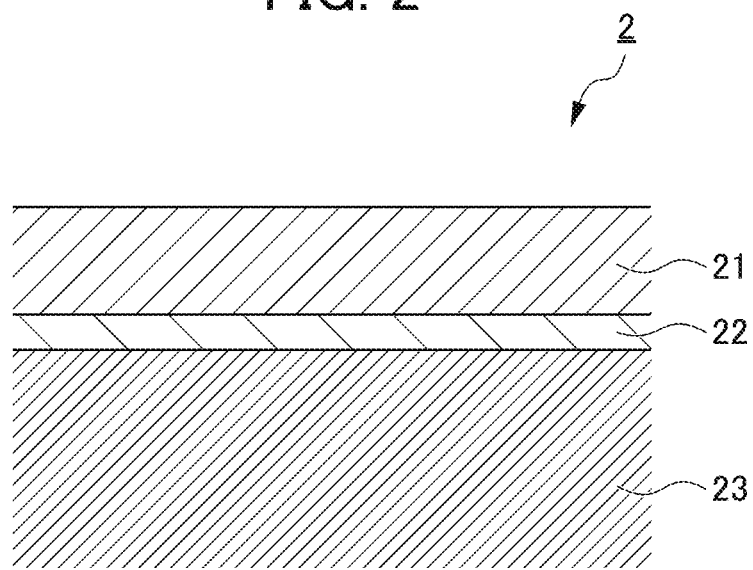
FIG. 2 is a schematic longitudinal sectional view of a metal wiring non-arrangement portion.

FIG. 2 is a schematic longitudinal sectional view of the metal wiring non-arrangement portion. In the metal wiring non-arrangement portion 2, the metal oxide layer 21, a second diffusion layer 22, and the second organic insulating layer 23 are stacked with each other. The metal oxide layer 21 described herein includes the oxide of the second metal element. The second diffusion layer 22 includes the second metal element. As described above, the second metal element is the element showing the stronger oxide-forming tendency than that of the first metal element.

[Metal Oxide Layer]

The metal oxide layer 21 includes the oxide of the above-described second metal element.

When the circuit board includes the metal oxide layer 21 as described above, degradation due to ion migration between the wiring can be reduced even if the circuit board includes a plurality of metal wiring arrangement portions 1 and the width of the metal wiring 11 and an interval between the lines of metal wiring 11 are miniaturized. Particularly, the oxide of the second metal element forms an insulating oxide, so that current leakage between the metal wiring can be reduced.

Although not particularly limited, the average thickness of the metal oxide layer 21 is preferably equal to or greater than 4 nm, more preferably equal to or greater than 8 nm, and much more preferably equal to or greater than 16 nm. When the average thickness of the metal oxide layer 21 is equal to or greater than a certain amount, the continuity of the metal oxide layer 21 can be maintained by reduction in the non-uniformity of a layer thickness, and ion migration and leakage between the wiring can be reduced. Moreover, the average thickness of the metal oxide layer 21 is preferably equal to or less than 240 nm, more preferably equal to or less than 160 nm, and much more preferably equal to or less than 80 nm. Time and cost are required for forming the thick metal oxide layer 21 and a metal layer as a precursor of the metal oxide layer 21, and therefore, the average thickness of the metal oxide layer 21 is set to equal to or less than a certain amount.

[Second Diffusion Layer]

The second diffusion layer 22 includes the second metal element. The circuit board has such a second diffusion layer 22, and therefore, high adhesion between the metal oxide layer and the organic insulating layer can be maintained. Note that an interface between the second diffusion layer 22 and the second organic insulating layer 23 is defined as a position at which in the case of EDX measurement of the longitudinal sectional shape of the circuit board as illustrated in FIG. 2, an intensity derived from a carbon atom is 80% with respect to the maximum intensity derived from the carbon atom in the second organic insulating layer 23 when scanning is performed in a direction from the organic insulating layer 23 to the second diffusion layer 22. A distance between an interface position between the second diffusion layer 22 and the organic insulating layer 23 as set above and a surface position of the metal oxide layer is taken as the thickness of the second diffusion layer. Similar EDX measurement is performed for five different sections, and the average of these measurement results is taken as the average thickness of the second diffusion layer.

Note that part of the second diffusion layer 22 may include an organic insulating body. That is, in such a partial region of the second diffusion layer 22, the second metal element and the organic insulating body can coexist. Moreover, in this region, the second metal element is preferably diffused in the organic insulating body. When the second metal element is diffused in the organic insulating body as described above, the adhesion between the metal oxide layer 21 and the organic insulating layer 23 can be further enhanced.

Although not particularly limited, the average thickness of the second diffusion layer 22 is preferably equal to or greater than 5 nm and more preferably equal to or greater than 10 nm. When the average thickness of the second diffusion layer 22 is equal to or greater than a certain amount, the adhesion between the metal oxide layer and the organic insulating layer can be enhanced. Moreover, the average thickness of the second diffusion layer 22 is preferably equal to or less than 100 nm, more preferably equal to or less than 70 nm, and much more preferably equal to or less than 50 nm. When the average thickness of the second diffusion layer 22 is equal to or less than a certain amount, occurrence of current leakage between the metal wiring can be reduced in the organic insulating layer.

Note that the second diffusion layer 22 may include the first metal element. In the circuit board produced by the later-described production method, the first metal element can be included particularly in the vicinity of a boundary with the metal wiring arrangement portion 1.

[Second Organic Insulating Layer]

As the second organic insulating layer 23, one similar to the first organic insulating layer 13 can be used.

[Relationship Between First Diffusion Layer and Second Diffusion Layer]

In the circuit board as described above, the average thickness of the first diffusion layer 12 is preferably greater than the average thickness of the second diffusion layer 22. The circuit board as described above has the first organic insulating layer 13 and the second organic insulating layer 23, and therefore, the flexibility derived from these insulating layers can be exhibited. However, if the average thickness of the first diffusion layer 12 and the average thickness of the second diffusion layer 22 are uniformly thin across the entirety of the circuit board, the effect of further enhancing the adhesion between the metal wiring 11 and the first organic insulating layer 13 by the first diffusion layer 12 cannot be obtained in some cases. On the other hand, if the average thickness of the first diffusion layer 12 and the average thickness of the second diffusion layer 22 are uniformly thick across the entirety of the circuit board, stress increases at the interface between the first diffusion layer 12 and the first organic insulating layer 13 as well as the interface between the second diffusion layer 22 and the second organic insulating layer 23, and the flexibility of the circuit board tends to less likely to be obtained. For these reasons, the thickness of the first diffusion layer 12 is set to be greater than the thickness of the second diffusion layer 22. With this configuration, the stress at the interface between the first diffusion layer 12 and the first organic insulating layer 13 and the interface between the second diffusion layer 22 and the second organic insulating layer 23 can be dispersed, and the flexibility derived from the first organic insulating layer 13 and the second organic insulating layer 23 can be maintained higher. Note that if the thickness of the second diffusion layer 22 is greater than the thickness of the first diffusion layer 12, the circuit board tends to carry the flexibility, but the adhesion between the metal wiring 11 and the first organic insulating layer 13 tends to be degraded.

Although not particularly limited, the average thickness of the first diffusion layer with respect to the average thickness of the second diffusion layer (the average thickness of the first diffusion layer/the average thickness of the second diffusion layer) is, for example, preferably equal to or greater than twice, more preferably equal to or greater than five times, much more preferably equal to or greater than ten times, and still much more preferably equal to or greater than 20 times. When the average thickness of the first diffusion layer with respect to the average thickness of the second diffusion layer is equal to or greater than a certain amount, the stress dispersion effect at the interface between the first diffusion layer 12 and the first organic insulating layer 13 as well as the interface between the second diffusion layer 22 and the second organic insulating layer 23 can be further enhanced, and a high flexibility derived from the first organic insulating layer 13 and the second organic insulating layer 23 can be maintained higher. On the other hand, the average thickness of the first diffusion layer with respect to the average thickness of the second diffusion layer is preferably equal to or less than 500 times, more preferably equal to or less than 400 times, much more preferably equal to or less than 300 times, and still much more preferably equal to or less than 200 times. When the average thickness of the first diffusion layer with respect to the average thickness of the second diffusion layer is equal to or less than a certain amount, it is possible to reduce formation of cracks due to stress concentration caused by a rapid change in the thickness of the diffusion layer in a transition region between the first diffusion layer and the second diffusion layer.

The above-described circuit board has a high flexibility, and the metal wiring has a high conductivity and is resistant to, e.g., detachment because of a high adhesion between the metal wiring and the organic insulating layer. Thus, the circuit board can be used as a flexible circuit board. Further, as described in detail below, a functional component is joined to the above-described wiring, so that a flexible electronic device can be provided. Moreover, such an electronic device exhibits a high conductivity and a high adhesion between the metal wiring and the organic insulating layer.

<Electronic Device>

The device of the present invention includes the metal wiring arrangement portion, the metal wiring non-arrangement portion, and a component having one or more components selected from the group consisting of a passive component and an active component. As the metal wiring arrangement portion and the metal wiring non-arrangement portion as described herein, those similar to the metal wiring arrangement portion and the metal wiring non-arrangement portion described above regarding the circuit board can be used. Thus, only the component will be described herein in detail.

[Component]

The component includes one or more components selected from the group consisting of the passive component and the active component. Such a component is connected to the metal wiring.

Although not particularly limited, a resistor, a multilayer capacitor, an inductor, etc. are preferably used as the passive component, for example.

Although not particularly limited, a transistor, a diode, a light emitting diode (LED), etc. are preferably used as the active component, for example.

Such a component and the metal wiring are preferably joined to each other with solder alloy, for example. Preferably, upon joining between the component and the metal wiring, the solder alloy or a metal element as a component of the solder alloy is present in the void in the porous structure of the metal wiring, but is not present in the first diffusion layer. Upon joining, the metal wiring is, from a surface thereof, impregnated with the solder alloy to fill the void among the metal particles, so that the component and the metal wiring can be joined to each other. However, when the solder alloy penetrates the metal wiring to reach the organic insulating layer, there is a probability that the metal wiring impregnated with the solder alloy is detached from the organic insulating layer and is disconnected.

Although not particularly limited, lead solder alloy such as Pb—Sn—Ag or lead-free solder alloy such as Sn—Ag—Cu is preferably used as the solder alloy.

In the above-described electronic device, the component is joined to the metal wiring, so that a flexible electronic device having functionality can be provided.

<Method for Producing Circuit Board>

One example of the method for producing the circuit board as described above will be described. The circuit board production method according to the present embodiment includes a metal layer formation step, a pre-sintered board formation step, and a sintering step. Hereinafter, each step will be described in detail.

[Metal Layer Formation Step]

The metal layer formation step is the step of forming the metal layer from the second metal element on a surface of the organic insulating layer.

Specifically, although not particularly limited, the method for forming the metal layer on the surface of the organic insulating layer includes, for example, a sputtering method, an electron beam deposition method, a chemical vapor deposition method, and a method in which an organic metal complex containing the second metal element is applied, dried, and fired. Note that in such a method, the organic insulating layer is, based on whether or not the metal wiring is subsequently formed on the surface of the metal layer, classified into the first diffusion layer or the second diffusion layer in the above-described circuit board.

[Pre-Sintered Board Formation Step]

The pre-sintered board formation step is the step of constituting a pre-sintered board which further includes pre-sintered wiring containing the first metal element on the surface of the metal layer formed at the metal layer formation step.

Note that in this step, exposure of a metal layer-organic insulating layer composite to an atmosphere including oxidizing gas needs to be reduced as much as possible. Exposure time may be selected as necessary according to the type and concentration of the oxidizing gas, and generally in a case where the oxidizability of the oxidizing gas is high and the concentration of the oxidizing gas is high, exposure time tends to be short. Particularly in the method described herein, exposure to air may be required for the sake of convenience in a production step, but is preferably equal to or less than 24 hours. Such exposure of the metal layer-organic insulating layer composite to the oxidizing gas might lead excessive oxidization of the second metal element arranged in the metal layer before sintering, thereby bringing no or extremely-small diffusion of the first metal element and the second metal element to the organic insulating layer in the metal wiring arrangement portion 1 or no or extremely-small diffusion of the second metal element to the organic insulating layer in the metal wiring non-arrangement portion 2 (particularly the former diffusion of these). Moreover, there is a probability that in the circuit board obtained as described above, the average thickness of the first diffusion layer 12 is not greater than the average thickness of the second diffusion layer 22.

Note that the oxidizing gas indicates gas having oxidizability, and specifically indicates oxygen, ozone, nitrous oxide, nitrogen monoxide, nitrogen dioxide, fluorine, chlorine, chlorine dioxide, nitrogen trifluoride, chlorine trifluoride, silicon tetrachloride, oxygen difluoride, perchloryl fluoride, etc. For example, air is also considered as the atmosphere containing the oxidizing gas.

When the metal layer is formed on the above-described metal layer-organic insulating layer composite at the pre-sintered board formation step, and heating treatment is performed for the pre-sintered board at the later-described sintering step, the metal wiring can be obtained such that the average thickness of the first diffusion layer 12 is greater than the average thickness of the second diffusion layer 22. Moreover, in such metal wiring, the stress at the interface between the first diffusion layer 12 and the first organic insulating layer 13 and the interface between the second diffusion layer 22 and the second organic insulating layer 23 is dispersed, flexibility degradation which might be caused due to the first diffusion layer 12 and the second diffusion layer 22 is reduced, and a high flexibility is exhibited, as described above.

Specifically, the method for forming the pre-sintered wiring includes, for example, a method in which conductive paste including the first metal element is prepared and the wiring is formed by, e.g., a screen printing method. Although not particularly limited, one preferred example of the conductive paste will be described in detail below as the conductive paste.

[Conductive Paste]

One example of the conductive paste of the present invention includes metal particles, binder resin, and a solvent.

(Metal Particle)

The metal particle includes the first metal element.

Although not particularly limited as long as the metal particle includes the first metal element, the metal particle is preferably a particle produced by a method such as a gas atomizing method, a water atomizing method, or a liquid phase reduction precipitation method and having 50% of particle sizes equal to or greater than 70 nm and equal to or less than 10 μm.

(Binder Resin)

The content of the binder resin in the organic vehicle contained in the conductive paste is preferably equal to or greater than 0.05% by mass and equal to or less than 17.0% by mass. The binder resin is not particularly limited as long as the binder resin is resin decomposed at the sintering step, but includes, for example, cellulose resin such as methylcellulose, ethylcellulose, and carboxymethylcellulose, acrylic resin, butyral resin, alkyd resin, epoxy resin, and phenol resin. Of these resins, the cellulose-based resins showing such a tendency that such resin easily disappear from the paste due to reaction with oxygen or carbon monoxide are preferably used. Of the cellulose-based resins, the ethylcellulose is more preferably used.

In the case of performing atmospheric firing, the binder resin reacts with atmospheric air, so that the amount of resin remaining in the wiring after firing can be reduced as much as possible and an increase in wiring resistance due to the remaining resin can be reduced. Note that there is a probability that a binder resin component remains in the wiring, and sinterability is degraded and the wiring resistance is increased thereby. For this reason, by setting the content of the binder resin in the organic vehicle to be less than 17%, it is possible to ignore influence of the binder resin component remaining in the wiring after firing on the wiring resistance. On the other hand, if the percentage of the binder resin in the organic vehicle by mass is less than 0.05%, there is a probability that the viscosity of the conductive paste decreases and printability is degraded.

(Solvent)

Although the solvent contained in the conductive paste is not particularly limited as long as the solvent has a proper boiling point, a proper steam pressure, and a proper viscosity, the solvent includes, for example, a hydrocarbon-based solvent, a chlorinated hydrocarbon-based solvent, a cyclic ether-based solvent, an amide-based solvent, a sulfoxide-based solvent, a ketone-based solvent, an alcohol-based compound, a polyhydric alcohol ester-based solvent, a polyhydric alcohol ether-based solvent, a terpene-based solvent, and a mixture thereof. Of these solvents, texanol, butyl carbitol, butyl carbitol acetate, terpineol, etc., the boiling points of which are close to 200° C., are preferred.

(Other Components in Organic Vehicle)

The organic vehicle is a liquid mixture of all the binder resin, the solvent, and other organic substances added as necessary. In the case of firing in the atmosphere described in the present invention, it is enough to use the organic vehicle prepared by mixing of the binder resin and the solvent, but as necessary, a mixture of metal salt and polyol can be used. Examples of the metal salt include, in a case where Cu is used as the first metal element, copper acetate (II), copper benzoate (II), and bis(acetylacetonato) copper (II). In the case of using Ag, the metal salt includes, for example, silver acetate (I) and silver benzoate (I). In the case of using Ni, the metal salt includes, for example, nickel acetate (II), nickel benzoate (II), and bis(acetylacetonato) nickel (II). Moreover, the polyol includes, for example, ethylene glycol, diethylene glycol, trimethylene glycol, propylene glycol, and tetraethylene glycol. By addition of these substances, the polyol reduces the metal salt during firing and the reduced metal is deposited in the void between the particles, and therefore, the effect of enhancing electrical conductivity among the particles is enhanced.

Although not particularly limited, the content of the organic vehicle contained in the conductive paste is, for example, preferably equal to or greater than 3% by mass and equal to or less than 19% by mass and more preferably equal to or greater than 8% by mass and equal to or less than 15% by mass.

When the content of the organic vehicle contained in the conductive paste is equal to or greater than 3% by mass and equal to or less than 19% by mass, a wiring shape can be favorably held. If the content of the organic vehicle exceeds 19% by mass, the viscosity of the conductive paste decreases, leading to a probability that sagging of the printed wiring shape is caused. On the other hand, if the content of the organic vehicle is less than 3%, the viscosity of the conductive paste is too high, leading to a probability that a uniform wiring shape cannot be formed.

[Method for Producing Conductive Paste]

The conductive paste can be kneaded using an apparatus such as a planetary mixer after the binder resin and the solvent as described above have been mixed together and the metal particles have been added to such a mixture. Moreover, e.g., glass frit can also be added to the metal particles in a mass ratio equal to or less than 10% by mass. Further, particle dispersibility can be enhanced using a triple roll mill, as necessary.

[Sintering Step]

The sintering step is the step in which the pre-sintered board formed at the pre-sintered board formation step is subjected to heating at a temperature equal to or greater than 150° C. and equal to or less than 450° C. in an oxidizing atmosphere, followed by heating in a reducing atmosphere to sinter the same.

[Heating in an Oxidizing Atmosphere]

First, the pre-sintered board is heated in an atmosphere containing an oxidizing gas. By such heating, evaporation of the solvent, combustion and annihilation of the resin, and oxidization and sintering of the metal particles containing the first metal element are performed.

Due to heating accompanied by sintering, in a portion of the metal layer not having a pre-sintered wiring thereon (i.e., a portion in which the metal oxide layer 21 and the second diffusion layer 22 of the metal wiring non-arrangement portion 2 are formed after the later-described sintering step), one surface of the metal layer contacts with oxygen gas to generate a gas-solid reaction for forming the oxide, and the other surface thereof contact with the organic insulating layer to generate a solid phase reaction for diffusing the second metal element contained in the metal layer to the organic insulating layer. These types of reaction are competitive reaction, and the reaction rate thereof is higher in the former reaction as the gas-solid reaction than in the latter reaction as the solid phase reaction. That is, the reaction for changing the second metal element to the metal oxide is faster than the reaction for diffusing the second metal element to the organic insulating layer. In a case where the second metal element has changed to the metal oxide, such a second metal element is not diffused to the organic insulating layer.

On the other hand, in a portion of the metal layer having the pre-sintered wiring thereon (i.e., a portion in which the first diffusion layer 12 of the metal wiring arrangement portion 1 is formed after the later-described sintering step), direct contact of the second metal element arranged in the metal layer with oxygen is reduced by the pre-sintered wiring. That is, oxidation is reduced. The first metal element forming the pre-sintered wiring is diffused in the metal layer and the organic insulating layer as heating progresses, but such diffusion does not interfere with diffusion of the second metal element contained in the metal layer to the organic insulating layer.

Thus, according to the circuit board production method including heating in the oxidizing atmosphere as described above, diffusion of the second metal element to the organic insulating layer progresses in the portion having the pre-sintered wiring, and on the other hand, diffusion of the second metal element to the organic insulating layer is reduced in the portion having no pre-sintered wiring. Thus, in the obtained circuit board, the first diffusion layer tends to be thicker than the second diffusion layer.

As described above, if a certain amount of the metal layer or greater is oxidized in the portion of the metal layer having the pre-sintered wiring thereon (i.e., particularly the portion in which the first diffusion layer 12 of the metal wiring arrangement portion 1 is formed after the later-described sintering step), there is a probability that diffusion of the first metal element and the second metal element to the organic insulating layer is interfered. For this reason, exposure to the oxidizing gas such as air is preferably reduced as much as possible, between the metal layer formation step and the pre-sintered board formation step, to reduce oxidation of the metal layer.

For example, oxygen or atmospheric air can be used as the oxidizing gas. Alternatively, a mixture of gas other than the oxidizing gas and the oxidizing gas can be used. Inert gas (e.g., nitrogen gas or argon gas) can be used as the gas other than the oxidizing gas.

Although not particularly limited, the concentration of oxygen in the oxidizing atmosphere is, in terms of an oxygen partial pressure, preferably equal to or greater than 50 Pa, more preferably equal to or greater than 60 Pa, and much more preferably equal to or greater than 70 Pa. If these oxygen partial pressures are converted into concentrations in terms of a volume ratio in a case where the pressure of the atmosphere is an atmospheric pressure ($10^5$ Pa), the concentration is preferably equal to or greater than 500 ppm, more preferably equal to or greater than 600 ppm, and much more preferably equal to or greater than 700 ppm.

If the concentration of the oxidizing gas is less than 500 ppm, there is a probability that the resin is not sufficiently combusted and the resin component remains and degrades the sinterability. If the concentration exceeds 8000 ppm, there is a probability that a delicate sintered coating layer is formed due to rapid reaction made only in the vicinity of a surface of metal paste and interferes with internal reaction. When the concentration of the oxidizing gas is a certain amount, combustion and annihilation of the resin and oxidization and sintering of the metal particles can progress with favorable balance across the entirety of the paste.

As long as a heating temperature in the oxidizing atmosphere is equal to or greater than 150° C. and equal to or less than 450° C., the heating temperature is not particularly limited, but is preferably equal to or greater than 170° C., more preferably equal to or greater than 180° C., and much more preferably equal to or greater than 200° C. Moreover, the heating temperature is preferably equal to or less than 440° C., more preferably equal to or less than 420° C., and much more preferably equal to or less than 400° C. There is a probability that the resin remains at a temperature of less than 150° C., whereas there is a probability that the coating layer is formed and interferes with the internal reaction at a temperature exceeding 450° C. Further, there is a probability that property degradation occurs due to crystallization of the organic insulating layer.

[Heating in a Reducing Atmosphere]

Next, the oxidized board after heating in the oxidizing atmosphere is heated and sintered in a reducing atmosphere. For the sintered body including the first metal element formed by heating in the oxidizing atmosphere, the reduction processing of performing heating in nitrogen gas atmosphere containing reducing gas is performed, and a sintered board having the metal wiring can be obtained thereby as the sintered body including the first metal element.

As the reducing gas, hydrogen, carbon monoxide, formic acid, ammonia, etc. can be used. As gas other than the reducing gas, inert gas such as nitrogen gas or argon gas can be used.

Although not particularly limited, a reducing gas concentration is, in terms of a volume ratio, preferably equal to or greater than 0.5%, more preferably equal to or greater than 1%, and much more preferably equal to or greater than 2%, assuming that the pressure of the reducing atmosphere is the atmospheric pressure ($10^5$ Pa). If the reducing gas concentration is less than 0.5% in terms of a volume ratio, there is a probability that reduction of the oxide of the first metal element in the sintered body is not sufficiently performed, the metal oxide remains, and the metal wiring after firing exhibits a high electrical resistivity.

Although not particularly limited, the heating temperature in the reducing atmosphere is preferably equal to or greater than 150° C., more preferably equal to or greater than 170° C., much more preferably equal to or greater than 180° C., and still much more preferably equal to or greater than 200° C. Moreover, the heating temperature is preferably equal to or less than 450° C., more preferably equal to or less than 440° C., much more preferably equal to or less than 420° C., and still much more preferably equal to or less than 400° C. If the heating temperature is less than 150° C., there is a probability that the oxide of the first metal element remains. If the heating temperature exceeds 450° C., there is a probability that property degradation occurs due to crystallization of the organic insulating layer.

By performing the continuous sintering processing in the oxidizing/reducing atmosphere as described above, part of the first metal element and the second metal element are diffused in the organic insulating layer in the metal wiring arrangement portion, and the adhesion can be enhanced thereby at the interface between the metal wiring and the first organic insulating layer. On the other hand, in the metal wiring non-arrangement portion, the second metal element on a surface of the second organic insulating layer forms a metal oxide with excellent insulation properties when the thermal treatment is performed for the conductive paste in the atmosphere containing oxygen. Moreover, the second metal element is diffused in the organic insulating layer, so that the adhesion can be enhanced. Note that the oxide of the second metal element formed as described above is not reduced by heating in the reducing atmosphere, and is maintained as the oxide thereby.

[Pressure Application after Sintering]

The above-described sintered board can be directly used as the circuit board. Thus, although not an essential factor, a pressure may be applied to the metal wiring of the sintered board after heating in the reducing atmosphere as described above. When the pressure is applied as described above, the volume ratio of the void present in the metal wiring after the reducing thermal treatment decreases, the electrical resistivity decreases, and the durability against deformation is improved.

Although not particularly limited, the stress to be applied is, for example, preferably equal to or greater than 1 MPa and equal to or less than 10 MPa.

As one example of a pressure application method, rolling can be performed at a room temperature (e.g., −10 to 40° C., particularly about 25° C.). Although not particularly limited, a rolling reduction ((a thickness before rolling−a thickness after rolling)/the thickness before rolling) upon rolling is preferably equal to or greater than 5% and equal to or less than 50%.

High-temperature pressing can also be performed as one example of the pressure application method. In a temperature range of equal to or greater than 100° C. and equal to or less than 400° C., high-temperature pressing is preferably performed at a temperature lower than the temperature of heating in the reducing atmosphere as described above.

Note that the degree of relaxation of a resistance increase can be changed by controlling the rolling reduction in the case of rolling and by controlling a temperature, a pressure, and time in the case of high-temperature pressing.

According to such a production method, the circuit board with a high adhesion between the metal wiring and the organic insulating layer can be produced without use of photolithography. Particularly, when the circuit board is produced such that the pre-sintered board is exposed to the atmosphere containing the oxidizing gas for 24 hours or less, the average thickness of the first diffusion layer becomes greater than the average thickness of the second diffusion layer. Moreover, in the circuit board having the above-described configuration, flexibility degradation which might be caused due to the first diffusion layer and the second diffusion layer is reduced and a high flexibility is exhibited as described above.

<Method for Producing Electronic Device>

A device production method of the present invention includes a thin metal film formation step, a pre-sintered wiring formation step, a sintering step, and a component joining step. The metal layer formation step, the pre-sintered wiring formation step, and the sintering step can be performed similarly to those in the metal layer formation step, the pre-sintered wiring formation step, and the sintering step as described above in the circuit board production method. Thus, only the component joining step will be described herein in detail.

[Component Joining Step]

The component joining step is the step of applying a solder flux with a pH equal to or greater than 4 and equal to or less than 7 to the component to join the component to the metal wiring.

By using the solder flux with a pH of equal to or greater than 4 and equal to or less than 7, i.e., a mildly acidic or neutral solder flux, melting of the metal oxide layer including the second metal element by a strongly acidic flux can be avoided.

EXAMPLES

Hereinafter, the present invention will be described in more detail with reference to examples. The present invention is not limited by these examples.

Example 1

A flexible circuit was prepared as follows. A polyimide film (140 EN, a thickness of 35 μm) manufactured by Du Pont-Toray Co., Ltd. was used as an organic insulating layer. As the polyimide film, the delivered one was used intact. On one surface of this film, each of metal layers of manganese (Mn), chromium (Cr), vanadium (V), niobium (Nb), tantalum (Ta), titanium (Ti), and zirconium (Zr) as second metal elements was formed by a sputtering method. The thickness of the metal layer was 3 to 300 nm. After formation of the layer of the second metal element, wiring was formed using Cu paste, exposure time in atmosphere being within 24 hours. When the exposure time exceeded 24 hours, the surface of the second metal element was oxidized and stabilized. Thus, it was difficult to form a first diffusion layer. As a result, the adhesion strength of the metal wiring after firing was degraded, and the metal wiring was easily detached from a board in a tape test. Paste described in Example 1 of Japanese Unexamined Patent Application, Publication No. 2013-258128 was used as the Cu paste to screen-print a wiring shape with a width of 200 μm and an interval of 1 mm. These samples were dried for five minutes at 80° C. in atmosphere, and an oxidizing thermal treatment was performed for these samples for 30 minutes at 350° C. Thereafter, in a gas mixture atmosphere of nitrogen and 5% hydrogen, a reducing thermal treatment was performed for 30 minutes at the same temperature as that of the oxidizing thermal treatment. In the tape test for the Cu wiring after the reducing thermal treatment, no detachment was found. Moreover, the electrical resistivity of the Cu wiring was 5 to 7 μΩ·cm.

The formed second metal element was left in atmosphere for one hour or 48 hours, and then the Cu paste was printed and subjected to oxidizing thermal treatment and reducing thermal treatment. The obtained samples were each bonded with a scotch tape with an adhesive strength of 4 N, and the obtained sample was evaluated on whether the Cu wiring remained adhered to the polyimide film or was detached from the polyimide film when the tape was peeled off therefrom. Results are shown in Table 1. In Table 1, the sample in which the Cu wiring was not detached even after tape bonding and peel-off had been repeatedly performed three times is indicated as A, the sample in which part of the Cu wiring was detached after the second evaluation is indicated by B, and the sample in which the Cu wiring was completely detached in the first evaluation or the sample in which the Cu wiring was naturally detached is indicated by C. As shown in Table 1, the sample was evaluated as C when the film thickness was 10 nm and the stand-by exposure time was 48 hours. On the other hand, when the stand-by exposure time was one hour, none of the samples showed peeling at the metal layer if the film thickness was equal to or greater than 5 nm. The samples were evaluated as A when the film thickness was equal to or greater than 10 nm in a case where the second metal element was Mn, Cr, or Ta, when the film thickness was equal to or greater than 20 nm in a case where the second metal element was V, Nb, or Ti, and when the film thickness was equal to or greater than 50 nm in a case where the second metal element was Zr. The same results were also obtained when the thermal treatment temperature was set to 300° C. or 400° C.

TABLE 1

|  | Mn | Cr | V | Nb | Ta | Ti | Zr |
|---|---|---|---|---|---|---|---|
| 10 nm (48 hours) | C | C | C | C | C | C | C |
| 3 nm (1 hour) | C | C | C | C | C | C | C |
| 5 nm (1 hour) | B | B | B | B | B | B | B |
| 10 nm (1 hour) | A | A | B | B | A | B | B |
| 20 nm (1 hour) | A | A | A | A | A | A | B |
| 50 nm (1 hour) | A | A | A | A | A | A | A |
| 100 nm (1 hour) | A | A | A | A | A | A | A |
| 200 nm (1 hour) | A | A | A | A | A | A | A |
| 300 nm (1 hour) | A | A | A | A | A | A | A |

Next, an electrical resistivity between the Cu wiring was measured. For measurement, two current terminals and two voltage terminals were arranged on adjacent Cu wiring, and calculation was made using the obtained current and voltage values. All samples shown in Table 1 showed sufficient insulation properties such that each electrical resistivity was equal to or greater than 1 MΩ. Moreover, the metal layers shown in Table 1 were partially consumed due to diffusion to the organic insulating layer to form a second diffusion layer. On the other hand, when the metal layers are oxidized, the metal layers take oxygen ions, and for this reason, volume expansion occurs. As a result, in any sample, the thickness of a metal oxide layer was within a range of equal to or greater than 0.8 times and equal to or less than 1.5 times as great as the thickness of the metal layer shown in Table 1. Moreover, in any sample, the average thickness of the first diffusion layer measured by SEM-EDX was greater than the average thickness of the second diffusion layer.

Example 2

A film of each of Ta and Mn were formed with a thickness of 15 nm on a surface of the same polyimide film as that of Example 1, and Cu paste was screen-printed in a wiring shape and then dried at 80° C. This was subjected to oxidizing thermal treatment and reducing thermal treatment at 350° C. The obtained sample was cut and the section thereof was polished. Using a scanning electron microscope (SEM) and EDX attached thereto, observation of a structure at an interface between the Cu wiring and the polyimide film and analysis of a composition in the vicinity of the interface were performed.

Figure 3:
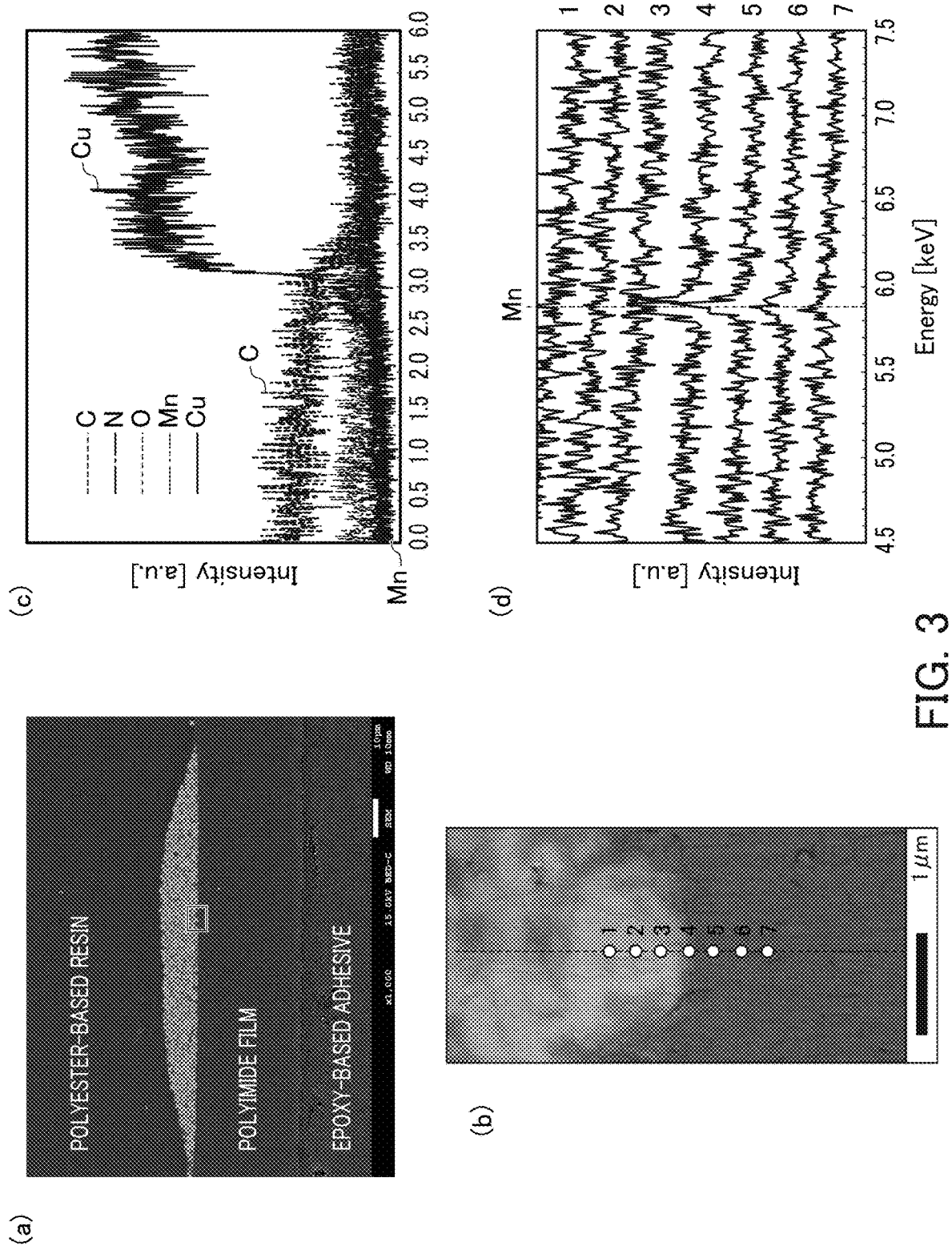
FIG. 3 shows SEM-EDX analysis results for a sample in which a film of Mn was formed on a polyimide film, FIG. 3(a) showing a sectional image of the entirety of a Cu wiring section, FIG. 3(b) showing an enlarged image of an interface portion, FIG. 3(c) showing results of line analysis by EDX for a region including Cu wiring and the polyimide film (a metal wiring arrangement portion), and FIG. 3(d) showing results of EDX point analysis for regions indicated by numbers in the enlarged view of FIG. 3(b)

SEM-EDX analysis results for the sample in which the film of Mn was formed on the polyimide film are shown in FIG. 3. FIG. 3(a) shows an image of the entirety of the Cu wiring section. FIG. 3(b) shows an enlarged image at an interface portion. Note that although details will be described later, EDX point analysis was performed for regions (hereinafter referred to as "regions 1 to 7") indicated by numbers 1 to 7 in FIG. 3(b). FIG. 3(c) shows results of line analysis by EDX for a region including the Cu wiring and the polyimide film (a metal wiring arrangement portion). Intensity distribution shows that an EDX intensity for Cu rapidly decreases at the interface and is weakened toward the inside of the polyimide film. This shows that Cu was diffused in the polyimide film. FIG. 3(d) shows results of the EDX point analysis for the regions 1 to 7 in the enlarged view of FIG. 3(b). EDX peaks for Mn were detected in the regions 2, 3, 4, and this shows that Mn was diffused in the polyimide film. The thickness of a first diffusion layer was about 0.5 μm.

Figure 4:
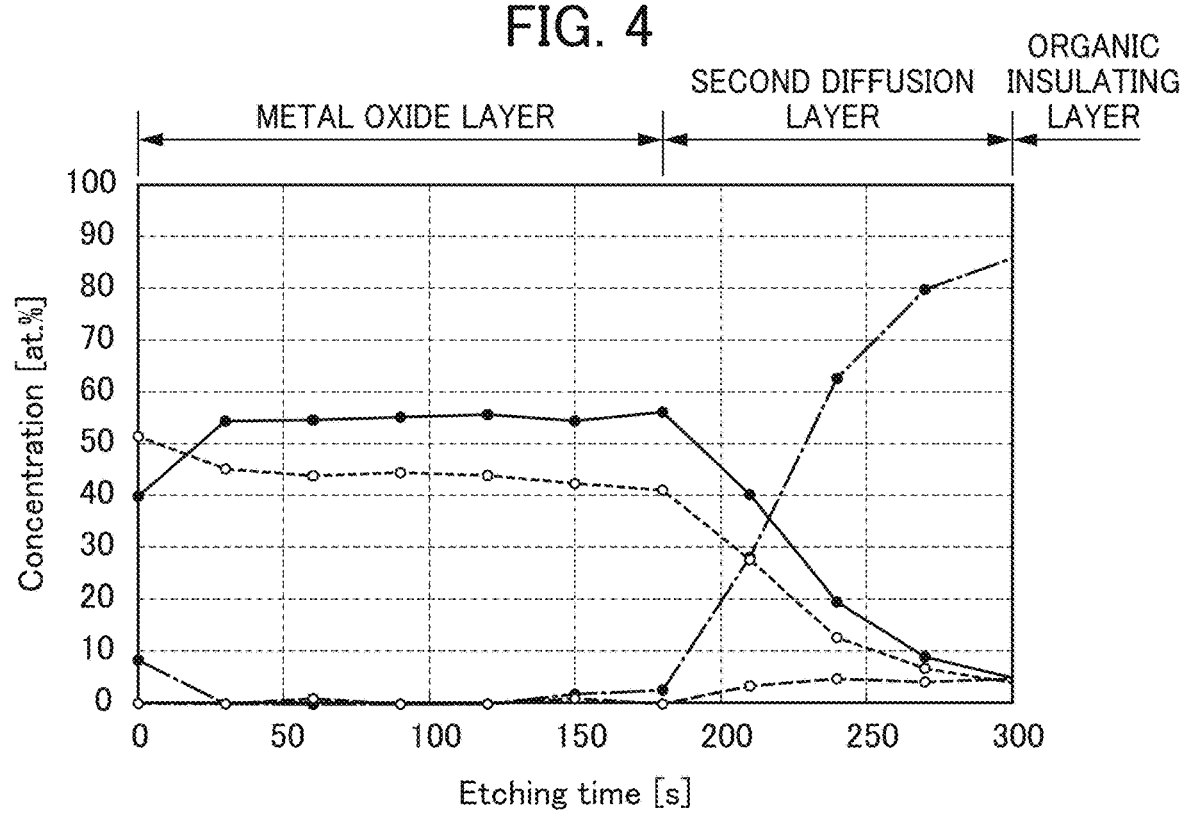
FIG. 4 shows XPS analysis results for a portion in which no Cu wiring is formed (a metal wiring non-arrangement portion) in the sample in which the film of Mn was formed on the polyimide film.

Using XPS, composition distribution in a portion of the same sample having no Cu wiring of the polyimide film was obtained. XPS analysis results for a portion having no Mn wiring in the sample in which the film of Mn was formed on the polyimide film (a metal wiring non-arrangement portion) are shown in FIG. 4. In FIG. 4, the horizontal axis indicates etching time when a sample surface was sputtered and etched with Ar ions. An etching speed was about 0.1 nm per second. The film of Mn formed on the polyimide film surface formed a Mn oxide, and the thickness thereof was about 20 nm. Mn, 0, C, and N were detected on a polyimide film side of the Mn oxide layer, and this shows that Mn was diffused in the polyimide film. The thickness of a second diffusion layer was about 10 nm.

In the sample in which the film of Ta was formed on the polyimide film, diffusion layers were observed as in the results for the sample in which the film of Mn was formed. In the case of Ta, the thickness of the first diffusion layer was about 0.1 μm, and the thickness of the second diffusion layer was about 10 nm.

Example 3

A film of Mn was formed with a thickness of 15 nm on a polyimide film with a width of 15 mm and a length of 8 cm, and Cu paste was printed. This was thermally treated to form Cu wiring with a width of 1.2 mm. The average thickness of a first diffusion layer measured by SEM-EDX was greater than the average thickness of a second diffusion layer. Thereafter, this sample was dipped in a copper sulfate solution to apply electrolytic Cu plating, and each void in the Cu wiring was filled with the electrolytic Cu plating. In another sample, epoxy was applied to a Cu wiring surface and was left in vacuum to penetrate the epoxy ingo the void in Cu wiring. The sample prepared as described above was attached to a tensile testing machine, and an electrical resistance change upon deformation was measured. A tensile direction was a longitudinal direction of the film, and the initial strain rate was set to $10^{-3}$/second. For electrical resistance measurement, a voltage terminal was attached to a position at 1 cm from a sample center portion, and a current terminal was attached to a position at 2 cm. A certain value of current (100 mA) was applied to the current terminal to measure a voltage in the course of deformation and obtain the electrical resistance change.

Figure 5:
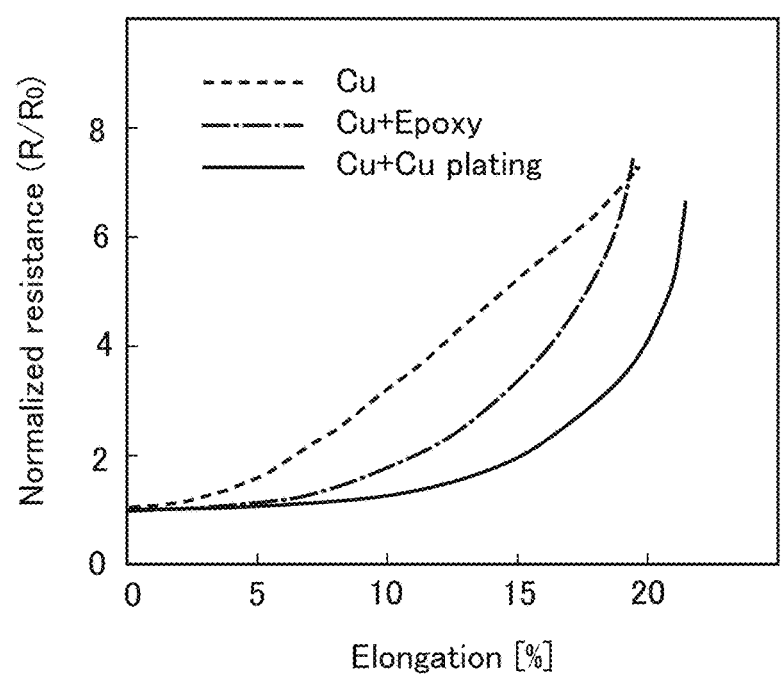
FIG. 5 shows electrical resistance change measurement results for three types of samples including a sample in which a void in the Cu wiring is filled with epoxy (Cu+Epoxy), a sample in which the void is filled with electrolytic Cu plating (Cu+Cu Plating), and a sample in which the void is not filled with anything (Cu)

FIG. 5 shows electrical resistance change measurement results for three types of samples including the sample that the void in the Cu wiring was filled with the epoxy (Cu+Epoxy), the sample that the void was filled with the electrolytic Cu plating (Cu+Cu Plating), and a sample that a void is not filled with anything (Cu). The vertical axis indicates a value obtained by division of the resistance value of each sample during deformation by the initial resistance value, and the horizontal axis indicates a value (%) obtained by division of the increment of the length of the sample during deformation by the initial gauge length (6 cm). A resistance increase during deformation is associated with an increase in the number of cracks formed in the wiring, and results from rupture of a structurally-weak neck portion. According to FIG. 5, when the void in the sintered Cu wiring was filled with the epoxy, the resistance increase was relaxed. When the void was filled with the electrolytic Cu plating, a resistance increase relaxation tendency was more noticeable. The epoxy and the electrolytic Cu plating used herein can be substituted with general thermosetting resin, Ni plating, or Au plating, and advantageous effects similar to the results shown in FIG. 5 can be expected.

Example 4

A film of Mn was formed with a thickness of 15 nm on a polyimide film with a width of 15 mm and a length of 8 cm, and Cu paste was printed. This was subjected to oxidizing thermal treatment and reducing thermal treatment at 350° C. to form Cu wiring with a width of 1.2 mm. The average thickness of a first diffusion layer measured by SEM-EDX was greater than the average thickness of a second diffusion layer. This sample was taken as a sample A.

A sample produced in a method similar to that of the sample A was dipped in a copper sulfate solution, electrolytic Cu plating was applied to the sample, and a void in Cu wiring was filled with the electrolytic Cu plating. This sample was taken as a sample B.

Epoxy was applied to a Cu wiring surface of a sample produced in a method similar to that of the sample A, and was left in vacuum to penetrate the epoxy resin into a void in Cu wiring. This sample was taken as a sample C.

For a sample produced in a method similar to that of the sample A, Cu paste was printed and thermally treated. Rolling was performed for this sample with a rolling reduction of 9% at a room temperature. This sample was taken as a sample D.

A stress of 2 MPa was applied to a sample produced in a method similar to that of the sample A at 250° C. by means of a high-temperature pressing apparatus, and the sample was held for 30 minutes. This sample was taken as a sample E.

Each sample produced as described above was attached to a tensile testing machine, and an electrical resistance change upon deformation was measured. A tensile direction is a longitudinal direction of the film, and an initial strain rate was $10^{-3}$/second. For electrical resistance measurement, a voltage terminal was attached to a position at 1 cm from a sample center portion, and a current terminal was attached to a position at 2 cm. A certain value of current (100 mA) was applied to the current terminal to measure a voltage in the course of deformation and obtain the electrical resistance change.

Figure 6:
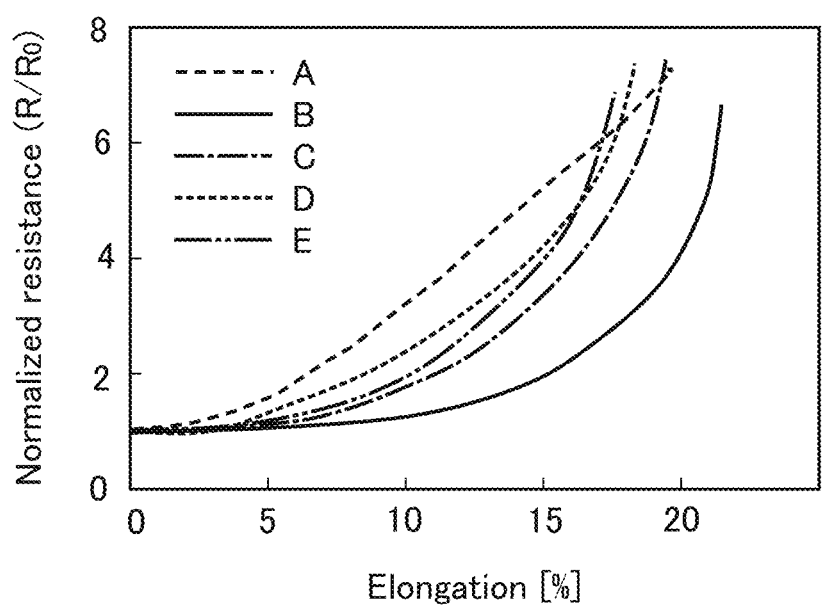
FIG. 6 shows electrical resistance change measurement results for samples A to E of Example 6.

FIG. 6 shows electrical resistance change measurement results for the samples A to E. The vertical axis indicates a value obtained by division of the resistance value of each sample during deformation by the initial resistance value, and the horizontal axis indicates a value (%) obtained by division of the increment of the length of the sample during deformation by the initial gauge length (6 cm). A resistance increase during deformation is associated with an increase in the number of cracks formed in the wiring, and results from rupture of a structurally-weak neck portion. According to FIG. 6, when the void in the sintered Cu wiring was filled with the epoxy, the resistance increase was relaxed. When the void was filled with the electrolytic Cu plating, resistance increase relaxation tendency was more noticeable. The resistance increase was relaxed by high-temperature pressing or rolling.

Example 5

By the method described in Example 1, a board having a Mn oxide and Cu wiring on a polyimide film was prepared.

A resistor, a capacitor, an inductor, a diode, an LED, a microprocessor, etc. can be mounted for providing functionality to this board. However, for joining these components to the Cu wiring, it is necessary to apply a solder flux and remove the oxide on a Cu wiring surface.

Upon joining, in a case where a flux including hydrochloric acid with a pH of 2 and 3 was used, the Cu wiring was detached. In a case where a solution of acetate with a pH of 4, 5, and 6 or a neutral flux with a pH of 7 was applied, the oxide on the Cu wiring surface could be removed without detachment of the Cu wiring. Next, the component was soldered to the Cu wiring to which a flux with a pH of 5 was applied. Solder alloy used for joining was Sn—Ag—Cu alloy. For different solder alloy amounts, soldering iron temperatures, and soldering time, optimal joining conditions were searched. As a result of analysis of a detached portion of a sample in which the Cu wiring was detached after a soldering test, it was found that the solder alloy penetrated a Cu electrode and reached an interface between the Cu electrode and the polyimide film. In a sample in which no Cu electrode was detached, no solder alloy reached the interface. According to these results, in component mounting it is necessary to use a solder flux with a pH equal to or greater than 4 and equal to or less than 7, and to prevent the solder alloy from penetrating the Cu electrode and reaching the interface between the Cu electrode and the polyimide film.

EXPLANATION OF REFERENCE NUMERALS

1 Metal Wiring Arrangement Portion
11 Metal Wiring
12 First Diffusion Layer
13 First Organic Insulating Layer
2 Metal Wiring Non-Arrangement Portion
21 Metal Oxide Layer
22 Second Diffusion Layer
23 Second Organic Insulating Layer

The invention claimed is:

1. A circuit board comprising:
a metal wiring arrangement portion and a metal wiring non-arrangement portion, wherein,
in the metal wiring arrangement portion, metal wiring, a first diffusion layer, and a first organic insulating layer are stacked with each other, and the metal wiring and the first organic insulating layer are disposed at each end in a stacking direction of the metal wiring and the first organic insulating layer,
in the metal wiring non-arrangement portion, a metal oxide layer, a second diffusion layer, and a second organic insulating layer are stacked with each other, and the metal oxide layer and the second organic insulating layer are disposed at each end in a stacking direction of the metal oxide layer and the second organic insulating layer,
the metal wiring includes a first metal element,
the first diffusion layer includes the first metal element and a second metal element,
the metal oxide layer includes an oxide of the second metal element, the second diffusion layer includes the second metal element, and the second metal element has a stronger oxide-forming tendency than that of the first metal element.

2. A circuit board comprising:

a metal wiring arrangement portion and a metal wiring non-arrangement portion, wherein, in the metal wiring arrangement portion, metal wiring, a first diffusion layer, and a first organic insulating layer are stacked with each other, and the metal wiring and the first organic insulating layer are disposed at each end in a stacking direction of the metal wiring and the first organic insulating layer, in the metal wiring non-arrangement portion, a metal oxide layer, a second diffusion layer, and a second organic insulating layer are stacked with each other, and the metal oxide layer and the second organic insulating layer are disposed at each end in a stacking direction of the metal oxide layer and the second organic insulating layer, the metal wiring includes a first metal element, the first diffusion layer includes the first metal element and a second metal element, the metal oxide layer includes an oxide of the second metal element, the second diffusion layer includes the second metal element, the first metal element is one or more elements selected from the group consisting of Cu, Ag, and Ni, and the second metal element is one or more elements selected from the group consisting of Mn, Cr, V, Nb, Ta, Ti, and Zr.

3. A circuit board comprising:

a metal wiring arrangement portion and a metal wiring non-arrangement portion, wherein, in the metal wiring arrangement portion, metal wiring, a first diffusion layer, and a first organic insulating layer are stacked with each other, and the metal wiring and the first organic insulating layer are disposed at each end in a stacking direction of the metal wiring and the first organic insulating layer, in the metal wiring non-arrangement portion, a metal oxide layer, a second diffusion layer, and a second organic insulating layer are stacked with each other, and the metal oxide layer and the second organic insulating layer are disposed at each end in a stacking direction of the metal oxide layer and the second organic insulating layer, an average thickness of the first diffusion layer is greater than an average thickness of the second diffusion layer, the metal wiring includes a first metal element, the first diffusion layer includes the first metal element and a second metal element, the metal oxide layer includes an oxide of the second metal element, the second diffusion layer includes the second metal element, and the second metal element has a stronger oxide-forming tendency than that of the first metal element.

4. The circuit board according to claim 3, wherein the first metal element is one or more elements selected from the group consisting of Cu, Ag, and Ni, and the second metal element is one or more elements selected from the group consisting of Mn, Cr, V, Nb, Ta, Ti, and Zr.

5. The circuit board according to claim 1, wherein an average thickness of the first diffusion layer with respect to an average thickness of the second diffusion layer (the average thickness of the first diffusion layer/ the average thickness of the second diffusion layer) is equal to or greater than five times and equal to or less than 500 times.

6. The circuit board according to claim 1, wherein the metal wiring has a porous structure.

7. The circuit board according to claim 6, wherein the metal wiring includes metal plating made of one or more elements selected from the group consisting of Cu, Ag, and Ni in a void in the porous structure.

8. The circuit board according to claim 6, wherein the metal wiring includes thermosetting resin in a void in the porous structure.

9. An electronic device comprising:

a metal wiring arrangement portion, a metal wiring non-arrangement portion, and at least one electronic component selected from a passive component and an active component, wherein, in the metal wiring arrangement portion, metal wiring, a first diffusion layer, and a first organic insulating layer are stacked with each other, and the metal wiring and the first organic insulating layer are disposed at each end in a stacking direction of the metal wiring and the first organic insulating layer, in the metal wiring non-arrangement portion, a metal oxide layer, a second diffusion layer, and a second organic insulating layer are stacked with each other, and the metal oxide layer and the second organic insulating layer are disposed at each end in a stacking direction of the metal oxide layer and the second organic insulating layer, the metal wiring includes a first metal element, the first diffusion layer includes the first metal element and a second metal element, the metal oxide layer includes an oxide of a second metal element, the second diffusion layer includes the second metal element, the second metal element has a stronger oxide-forming tendency than that of the first metal element, and the at least one electronic component is connected to the metal wiring.

10. An electronic device comprising:

a metal wiring arrangement portion, a metal wiring non-arrangement portion, and at least one electronic component selected from a passive component and an active component, wherein, in the metal wiring arrangement portion, metal wiring, a first diffusion layer, and a first organic insulating layer are stacked with each other, and the metal wiring and the first organic insulating layer are disposed at each end in a stacking direction of the metal wiring and the first organic insulating layer, in the metal wiring non-arrangement portion, a metal oxide layer, a second diffusion layer, and a second organic insulating layer are stacked with each other, and the metal oxide layer and the second organic insulating layer are disposed at each end in a stacking direction of the metal oxide layer and the second organic insulating layer, the metal wiring includes a first metal element, the first diffusion layer includes the first metal element and a second metal element, the metal oxide layer includes an oxide of the second metal element, the second diffusion layer includes the second metal element, the first metal element is one or more elements selected from the group consisting of Cu, Ag, and Ni, the second metal element is one or more elements selected from the group consisting of Mn, Cr, V, Nb, Ta, Ti, and Zr, and the at least one electronic component is connected to the metal wiring.

11. An electronic device comprising:

a metal wiring arrangement portion, a metal wiring non-arrangement portion, and at least one electronic component selected from a passive component and an active component, wherein, in the metal wiring arrangement portion, metal wiring, a first diffusion layer, and a first organic insulating layer are stacked with each other, and the metal wiring and the first organic insulating layer are disposed at each end in a stacking direction of the metal wiring and the first organic insulating layer, in the metal wiring non-arrangement portion, a metal oxide layer, a second diffusion layer, and a second organic insulating layer are stacked with each other, and the metal oxide layer and the second organic insulating layer are disposed at each end in a stacking direction of the metal oxide layer and the second organic insulating layer, an average thickness of the first diffusion layer is greater than an average thickness of the second diffusion layer, the metal wiring includes a first metal element, the first diffusion layer includes the first metal element and a second metal element, the metal oxide layer includes an oxide of the second metal element, the second diffusion layer includes the second metal element, the second metal element has a stronger oxide-forming tendency than that of the first metal element, and the at least one electronic component is connected to the metal wiring.

12. The electronic device according to claim 9, wherein the metal wiring and the at least one electronic component are joined to each other by solder alloy, and the solder alloy is present in a void in the metal wiring.

* * * * *